United States Patent
Chen et al.

(10) Patent No.: US 8,942,035 B2
(45) Date of Patent: Jan. 27, 2015

(54) NON-SEQUENTIAL ENCODING SCHEME FOR MULTI-LEVEL CELL (MLC) MEMORY CELLS

(75) Inventors: Yiran Chen, Eden Prairie, MN (US); Dadi Setiadi, Edina, MN (US); Patrick J. Ryan, St. Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 968 days.

(21) Appl. No.: 13/070,021

(22) Filed: Mar. 23, 2011

(65) Prior Publication Data

US 2012/0243311 A1    Sep. 27, 2012

(51) Int. Cl.
*G11C 11/34* (2006.01)
*G11C 16/04* (2006.01)
*G11C 11/16* (2006.01)
*G11C 7/10* (2006.01)
*G11C 11/56* (2006.01)

(52) U.S. Cl.
CPC ............ *G11C 11/161* (2013.01); *G11C 7/1006* (2013.01); *G11C 11/5607* (2013.01); *G11C 11/5628* (2013.01); *G11C 16/0483* (2013.01); *G11C 2211/5648* (2013.01)
USPC ............ 365/185.03; 365/185.01; 365/185.33; 365/185.26

(58) Field of Classification Search
CPC ............ G11C 11/161; G11C 11/5628; G11C 11/5607; G11C 7/1006; G11C 11/5648; G11C 16/0483
USPC ............ 365/185.03, 185.01, 185.33, 185.26, 365/173, 129, 171, 157, 158, 163, 148, 145
See application file for complete search history.

(56) References Cited

U.S. PATENT DOCUMENTS

| | | | |
|---|---|---|---|
| 5,450,363 | A | 9/1995 | Christopherson et al. |
| 6,076,176 | A | 6/2000 | Priore et al. |
| 2007/0208905 | A1 | 9/2007 | Litsyn et al. |
| 2008/0002481 | A1* | 1/2008 | Gogl et al. ............... 365/189.06 |

(Continued)

FOREIGN PATENT DOCUMENTS

| | | |
|---|---|---|
| JP | 2001093288 | 4/2001 |
| JP | 2009259316 | 11/2009 |
| JP | 2010103952 | 5/2010 |

OTHER PUBLICATIONS

Xiaohua Lou, Zheng Gao, Dimitar V. Dimitrov and Michael X. Tang, "Demonstration of multilevel cell spin transfer switching in MgO magnetic tunnel junctions," Applied Phisics Letters 93, 2008, American Institute of Physics, US.

*Primary Examiner* — Son Dinh
*Assistant Examiner* — Uyen B Tran
(74) *Attorney, Agent, or Firm* — Hall Estill Attorneys at Law

(57) ABSTRACT

Apparatus and method for managing an array of multi-level cell (MLC) memory cells. In accordance with various embodiments, a non-sequential encoding scheme is selected that assigns a different multi-bit logical value to each of a plurality of available physical states of a selected MLC memory cell in relation to write effort associated with each of said plurality of physical states. Data are thereafter written to the selected MLC memory cell in relation to the selected non-sequential encoding scheme. In some embodiments, the MLC memory cell comprises a spin-torque transfer random access memory (STRAM) memory cell. In other embodiments, the MLC memory cell comprises an MLC flash memory cell.

20 Claims, 7 Drawing Sheets

(56) References Cited

U.S. PATENT DOCUMENTS

| | | | |
|---|---|---|---|
| 2008/0068885 A1* | 3/2008 | Kong et al. | 365/185.03 |
| 2008/0089129 A1 | 4/2008 | Lee | |
| 2008/0168215 A1* | 7/2008 | Jiang et al. | 711/103 |
| 2009/0046501 A1* | 2/2009 | Ranjan et al. | 365/171 |

* cited by examiner

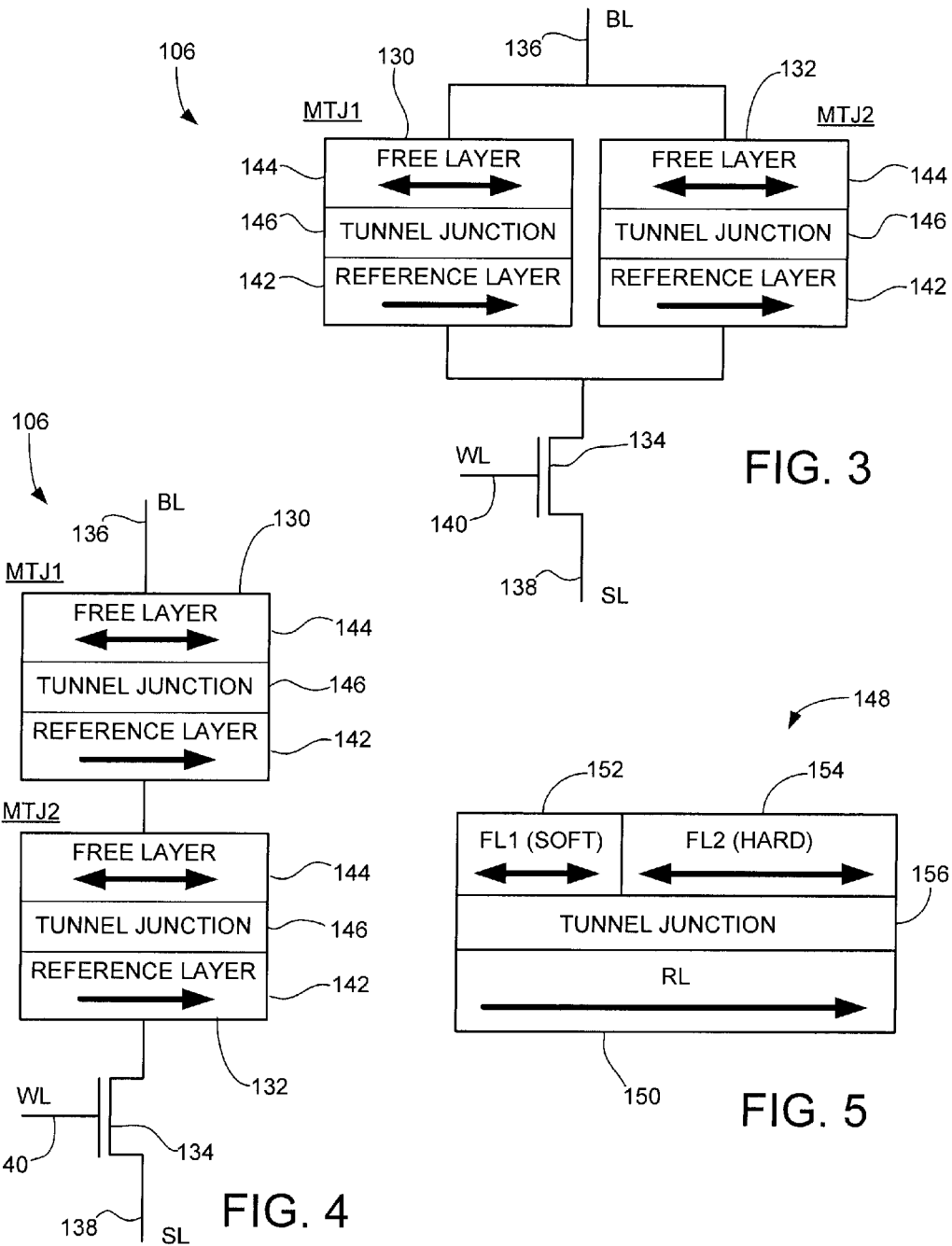

| LOGICAL STATES | ASSIGNED RESISTANCES | |
|---|---|---|
| 11 | S4 (2.5 kΩ) | S1 (0.5 kΩ) |
| 10 | S3 (1.5 kΩ) | S4 (2.5 kΩ) |
| 01 | S2 (1.0 kΩ) | S3 (1.5 kΩ) |
| 00 | S1 (0.5 kΩ) | S2 (1.0 kΩ) |
| | 1ST CODE SCHEME | 2ND CODE SCHEME |

| Value | 00 | 01 | 10 | 11 |
|---|---|---|---|---|
| Resistance coding 1 | R1 | R2 | R3 | R4 |
| Resistance coding 2 | R1 | R2 | R4 | R3 |
| Resistance coding 3 | R1 | R3 | R2 | R4 |
| Resistance coding 4 | R1 | R3 | R4 | R2 |
| Resistance coding 5 | R1 | R4 | R1 | R2 |
| Resistance coding 6 | R1 | R4 | R2 | R1 |
| Resistance coding 7 | R2 | R1 | R2 | R4 |
| Resistance coding 8 | R2 | R1 | R4 | R2 |
| Resistance coding 9 | R2 | R3 | R1 | R4 |
| Resistance coding 10 | R2 | R3 | R4 | R1 |
| Resistance coding 11 | R2 | R4 | R1 | R3 |
| Resistance coding 12 | R2 | R4 | R3 | R1 |
| Resistance coding 13 | R3 | R1 | R2 | R4 |
| Resistance coding 14 | R3 | R1 | R4 | R2 |
| Resistance coding 15 | R3 | R2 | R1 | R4 |
| Resistance coding 16 | R3 | R2 | R4 | R1 |
| Resistance coding 17 | R3 | R4 | R1 | R2 |
| Resistance coding 18 | R3 | R4 | R2 | R1 |
| Resistance coding 19 | R4 | R1 | R2 | R3 |
| Resistance coding 20 | R4 | R1 | R3 | R2 |
| Resistance coding 21 | R4 | R2 | R1 | R3 |
| Resistance coding 22 | R4 | R2 | R3 | R1 |
| Resistance coding 23 | R4 | R3 | R1 | R2 |
| Resistance coding 24 | R4 | R3 | R2 | R1 |

FIG. 8

NON-SEQUENTIAL ENCODING SCHEME FOR MULTI-LEVEL CELL (MLC) MEMORY CELLS

SUMMARY

Various embodiments of the present invention are generally directed to managing an array of multi-level cell (MLC) memory cells.

In accordance with various embodiments, a non-sequential encoding scheme is selected that assigns a different multi-bit logical value to each of a plurality of available physical states of a selected MLC memory cell in relation to write effort associated with each of the plurality of physical states. Data are thereafter written to the selected MLC memory cell in relation to the selected non-sequential encoding scheme.

These and other features and advantages which characterize the various embodiments of the present invention can be understood in view of the following detailed discussion and the accompanying drawings.

BRIEF DESCRIPTION OF THE DRAWINGS

FIG. 3 shows an MLC memory cell characterized as a spin-torque transfer random access memory (STRAM) memory cell in accordance with some embodiments.

FIG. 4 is an MLC memory cell characterized as an STRAM memory cell in accordance with other embodiments.

FIG. 5 depicts a portion of an MLC memory cell characterized as an STRAM memory cell in accordance with further embodiments.

FIG. 8 lists a population of available, alternative encoding schemes that could be selected for use with the memory cell of FIGS. 5-6.

DETAILED DESCRIPTION

Figure 1:
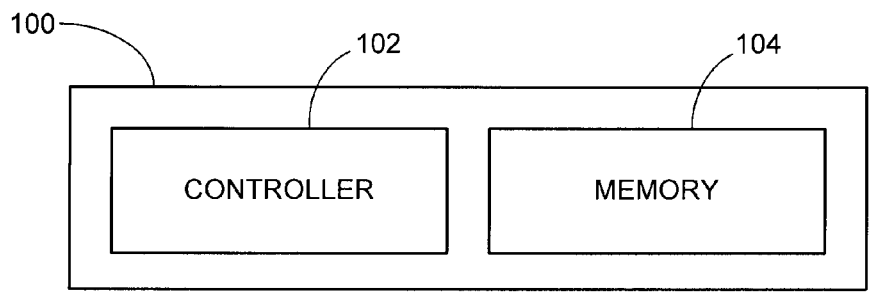
FIG. 1 is a generalized functional representation of an exemplary data storage device operated in accordance with various embodiments of the present invention.

The present disclosure generally relates to management of multi-level cell (MLC) memory arrays. Solid state memory is a developing technology aimed at providing reliable data storage and faster data transfer rates in ever decreasing form factors.

Recent developments have included the use of multi-bit solid state memory cells that employ the use of MLC (multi-level cell) programming. MLC cells allow the storage of more than one bit of data per cell. Generally, n stored bits in each cell can be represented by $2^n$ different cell states. For example, n=2 bits of data corresponding to the logical states 00, 01, 10 or 11 can be stored in a single memory cell if the cell is configured to have $2^2=4$ distinct states S1, S2, S3 and S4. In this case, state S1 might represent logical state 00, S2=01, S3=10 and S4=11.

These different cell states can be expressed in a variety of ways. A NAND flash memory cell configured as an MLC can provide four different levels of charge on a floating gate of the cell. Different control gate threshold voltages can be applied to the cell in order to determine the amount of stored charge on the floating gate, and hence, the programmed state of the cell.

More recently developed cell technologies, such as spin-torque transfer random access memory (STRAM) cells, can be configured as MLCs through the incorporation of multiple MTJs (magnetic tunneling junctions) within each cell, with each MTJ storing a single bit. Each MTJ includes a free layer and a reference layer, with the MTJ exhibiting a different electrical resistance depending on whether the free layer magnetization direction has been set to be parallel to or antiparallel to the magnetization direction of the reference layer.

While MLC programming is operable to increase data storage density, one limitation associated with MLC memory cells is the relative difficulty in the write effort to place the cells in the various programmed states. It will be appreciated that some programmed states are easier to achieve than others. For example, MTJs can be subject to asymmetric write characteristics in that some programmed states, such as the antiparallel state, may require greater current density and/or current pulse duration as compared to other states such as the parallel state. The relative orientation of switching devices, such as MOSFETs, within the cells can also contribute to harder and easier programming directions.

Another limitation often associated with MLC memory cells is that the operational lifetime of MLC cells can tend to be shortened in relation to increases in programming current/voltage levels. For example, some types of flash memory cells configured to store a single bit using single level cell (SLC) encoding may be able to endure 100,000 erasures or more before wearing out (e.g., physical breakdown of the floating gate/channel barrier). Configuring the same flash memory cells as MLC cells may reduce their operational lifetime to around 5,000 erasures before wearing out.

The present inventors have noted that, depending on the data patterns being written to a block of MLC memory cells, not all of the various cell states may be utilized at the same statistical frequency. Accordingly, as explained below, various embodiments of the present invention generally operate to assign a particular encoding scheme to a set of MLC memory cells in relation to the write effort required to establish the various state transitions. This can provide a number of benefits such as reduced power consumption, increased data throughput and extended operational life for the memory cells.

While the following discussion of various embodiments will primarily focus upon STRAM and flash memory cells, it will be appreciated that this is merely for purposes of illustration. The techniques disclosed herein can be readily adapted for any number of other types of volatile and non-volatile MLC memory cells.

FIG. 1 provides a simplified block representation of a data storage device 100 to illustrate an exemplary environment in which various embodiments of the present invention can be advantageously practiced. The device 100 includes a top level controller 102 and a memory module 104. The controller 102 may be programmable or hardware based and provides top level control of I/O operations with a host device (not shown). The controller 102 may be a separate component or may be incorporated directly into the memory module 104. The memory module may be a main data storage area for the device, or can constitute a local cache memory for the controller 102.

Figure 2:
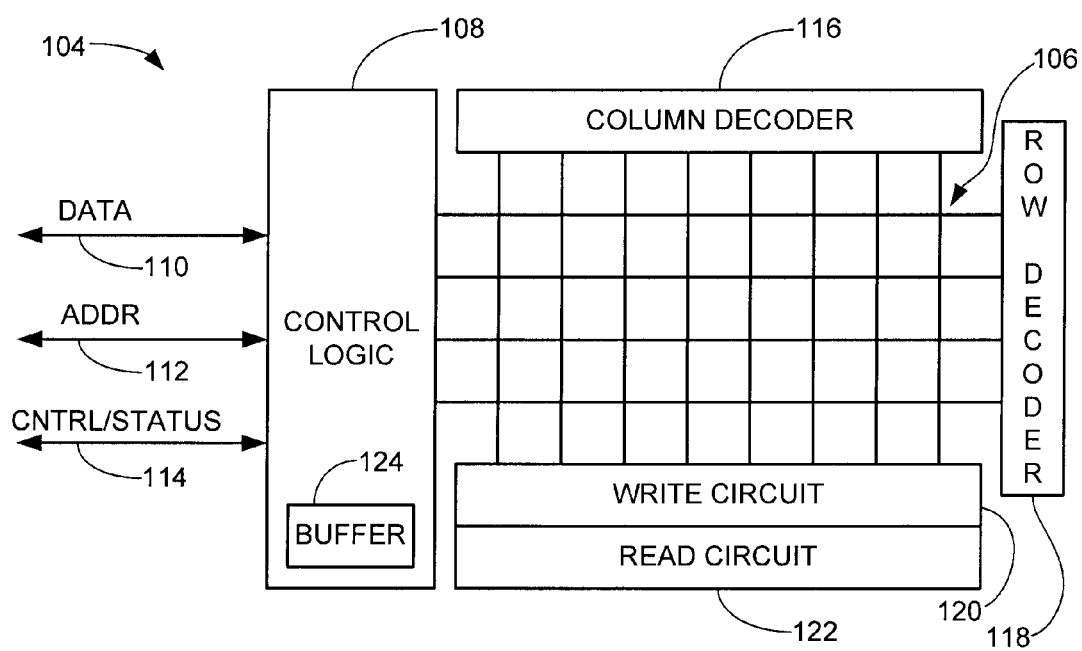
FIG. 2 shows an exemplary functional block diagram of circuitry used to read data from and write data to an array of the data storage device of FIG. 1.

FIG. 2 provides a generalized representation of the memory space 104 of FIG. 1. Data are stored as an arrangement of rows and columns of memory cells 106, accessible by various row and column control lines. The actual configurations of the cells and the access lines thereto will depend on the requirements of a given application.

Control logic 108 receives and transfers data, addressing information and control/status values along multi-line bus paths 110, 112 and 114, respectively. Column and row decoding circuitry 116, 118 provide appropriate switching and other functions to access the cells 106. A write circuit 120 represents circuitry elements that operate to carry out write operations to write data to the cells 106, and a read circuit 122 correspondingly operates to obtain readback data from the cells. Local buffering of transferred data and other values can be provided via one or more local registers 124.

An exemplary memory cell 106 is shown in FIG. 3 as an MLC spin-torque transfer random access memory (STRAM) cell. The cell 106 includes first and second magnetic tunneling junctions 130, 132, respectively denoted as MTJ1 and MTJ2. A switching device 134, characterized as an nMOSFET, is coupled to the MTJs as shown. In exemplary operations, data access operations can be carried out via a bit line (BL) 136, a source line (SL) 138, and a word line (WL) 140. The source lines for the various cells in the array may be connected to a common source plane in some configurations.

Each of the MTJs 130, 132 includes a reference layer 142, a free layer 144 and a tunneling junction 146. The respective MTJs 130, 132 can be independently programmed to a high or low electrical resistance based on the programmed magnetic orientation of the free layers 144 with respect to the magnetization direction of the reference layers 142. These programmed resistances can be achieved by applying appropriate bi-directional currents to the cell 106 between the bit line 136 and the source line 138.

The MTJs 130, 132 may be configured to have different switching characteristics; for example, the threshold current density required to switch MTJ1 from parallel to antiparallel may be lower than the threshold current density required to switch MTJ2 from parallel to antiparallel. This can be carried out in a number of ways, including by providing the respective MTJs with different areal extents, layer thicknesses, material compositions, etc. Each MTJ 130, 132 stores a single bit of data, so that the MLC cell 106 stores a total of two bits of data.

FIG. 4 shows an alternative configuration for the MLC cell 106, with the respective MTJs 130, 132 being arranged in a stacked configuration. As in FIG. 3, the MLC cell in FIG. 4 is also configured to store two bits of data, one bit in each MTJ.

FIG. 5 provides yet another configuration for the MLC cell 106, this time with a combined MTJ structure 148 having a common reference layer 150 and respective free layers 152, 154 separated by tunneling junction 156. The free layers 152, 154 are denoted as FL1 and FL2, and are respectively made of relatively soft and hard magnetic materials with different areal extents. The programmed states of the various MLC structures of FIGS. 3-5 can be sensed during a read operation by applying a relatively low magnitude read current and sensing the total voltage drop across the cell.

Figures 6, 7:
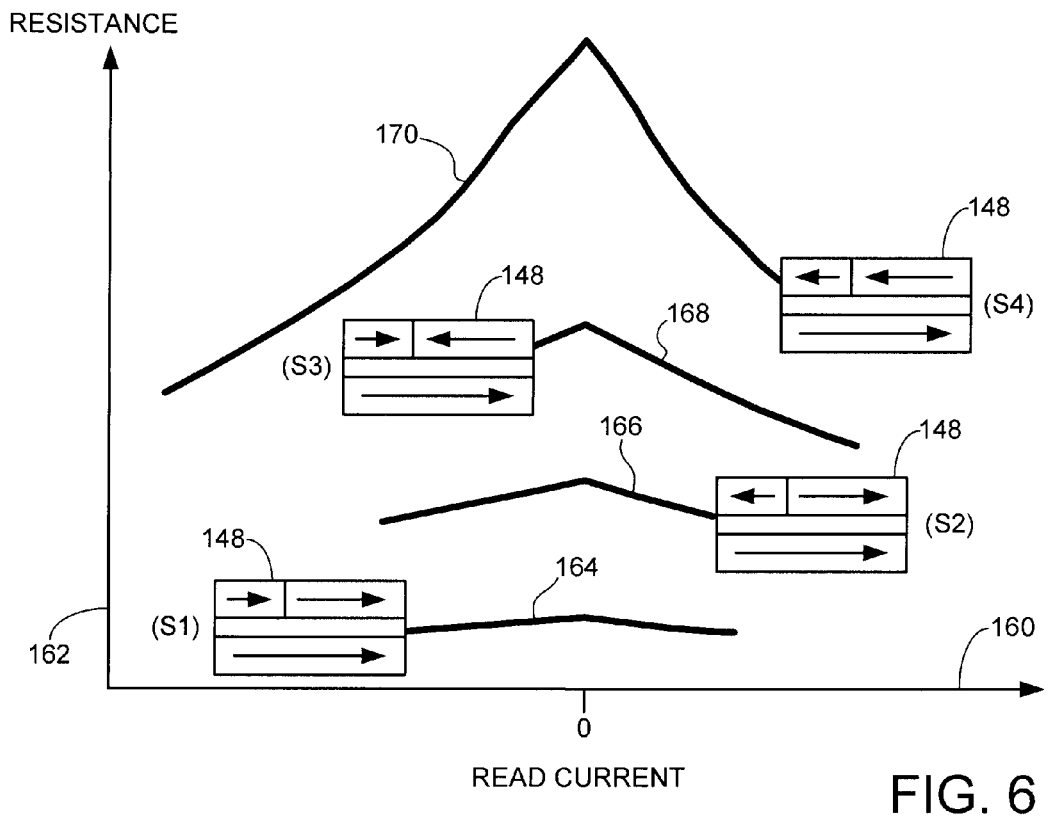
FIG. 6 graphs various exemplary physical states and corresponding operational characteristics of the memory cell of FIG. 5.
FIG. 7 shows the assignment of different encoding schemes to the memory cell of FIGS. 5-6.

FIG. 6 shows a series of current-resistance (I-R) curves for the exemplary structure 148 of FIG. 5. Read current magnitude is shown along x-axis 160, and total cell electrical resistance is represented along y-axis 162. The alternative MLC structures of FIGS. 3-4 may exhibit similar characteristics.

A first I-R curve 164 represents the resistance of the cell when the MTJ structure 148 of FIG. 5 is programmed in a first state (S1), namely, with both FL1 and FL2 having magnetizations that are parallel to the reference layer 150. Curve 166 represents a second state (S2) for the MTJ structure 148 in which FL1 is in the antiparallel state and FL2 is in the parallel state. Curve 168 represents a third state (S3) with FL1 in the parallel state and FL2 in the antiparallel state. Curve 170 shows a fourth state (S4) with both FL1 and FL2 in the antiparallel state.

It can be seen that the respective resistances of the various states S1, S2, S3 and S4 progress from lowest to highest, that is, R1<R2<R3<R4. Exemplary resistance values for a given read current magnitude might be on the order of about R1=0.5 kΩ; R2=1.01 kΩ R3=1.5 kΩ; and R4=2.5 kΩ. Of course, the actual sensed resistance will vary depending on the particular configuration and operational characteristics of a given cell, so these values are merely illustrative.

Varying magnitudes of switching currents may be required to transition the MLC structure 148 from one state to another. This is due to a number of factors, such as the larger programming energy needed to change the magnetization of the bit with higher coercivity and harder magnetic domain. Table 1 sets forth exemplary switching currents needed to transition between programmed logical state combinations for the MTJ structure 148. These values were obtained through the empirical analysis of a particular cell; it will be appreciated that different types of cells may provide different results.

TABLE 1

| | To | | | |
|---|---|---|---|---|
| From | S1 | S2 | S3 | S4 |
| S1 | 0 | −189 μA | ~0 μA | −280 μA |
| S2 | 130 μA | 0 | ~0 μA | −280 μA |
| S3 | 328 μA | ~0 μA | 0 | −45 μA |
| S4 | 328 μA | ~0 μA | 197 μA | 0 |

The use of a positive current value in Table 1 denotes a current direction from the free layer to the reference layer, and a negative current value denotes a current in the opposite direction. The magnetization direction for the soft domain of FL1 can be switched by itself without affecting the existing magnetization of the hard domain of FL2, and may require relatively low power. Switching the hard domain of FL2 may require significantly more power and may include a second operation to reset the soft domain FL1 back to its intended direction.

Table 1 shows that the cell has asymmetric power consumption requirements for different transitions. For example, transitioning from state S4 to state S1 may require significantly greater write current magnitude (e.g., on the order of 328 μA), whereas transitioning from state S3 to state S4 may require significantly less write current magnitude (e.g., on the order of 45 μA).

Table 2 shows the results of an empirical study of the relative frequency of different transitions carried out by a microprocessor, such as the controller 102 of FIG. 1, upon a block of MLC memory cells operated as an STRAM-based controller cache, such as the module 104 in FIG. 1. The various values 00, 01, 10 and 11 are multi-bit (two-bit) logical values that were written to various individual cells in the cache. The numbers in Table 2 show the relative frequency in terms of percentage (%) in which various transitions from one state to another took place when older data were overwritten with newer data as the microprocessor was operated.

TABLE 2

| From | To | | | |
| --- | --- | --- | --- | --- |
| | 00 | 01 | 10 | 11 |
| 00 | 64.08 | 4.01 | 3.55 | 3.92 |
| 01 | 1.71 | 5.44 | 0.80 | 0.56 |
| 10 | 1.44 | 0.70 | 4.22 | 0.70 |
| 11 | 1.92 | 0.56 | 0.61 | 5.06 |

It can be seen from Table 2 that most of the transitions occurred between the same values, so that the MTJ resistance states did not need to change at all for those particular writes. This occurred 78.80% (64.08+5.44+4.22+5.06) of the time. The most commonly written value was logical 00, which occurred almost two-thirds of the time.

During the remaining 21.2% of the time, various memory cells changed from a first state to a second state as older data were overwritten with different, newer data. Significant variation was observed with regard to these various state transitions, as some transitions occurred at a rate that was several times that of other transitions. For example, the frequency of transition from logical 00 to logical 11 (3.92%) was about 7 times greater than the frequency of transition from 11 to 01 (0.56%) or from 11 to 10 (0.61%).

It is common in conventional MLC memory arrays to sequentially assign the respective logical values to the available physical states of the cells. For example, a typical encoding scheme for the MTJ structure 148 of FIGS. 5-6 might involve sequentially assigning logical values as follows: logical "00" to state S1; logical "01" to state S2; logical "10" to state S3; and logical "11" to state S4.

By contrast, various embodiments of the present invention select an alternate, non-sequential encoding scheme for at least one MLC memory cell in the array. The alternate encoding scheme assigns a different multi-bit logical value to each of the different physical states of the MLC cell in relation to a write effort associated with each of the physical states. Data are thereafter written to the cell in relation to the selected encoding scheme.

The write effort to achieve the various states can be determined in a number of ways. For example, the write effort can be based on power consumption characteristics of the array such as exemplified in Table 1, and/or transition frequency statistics such as exemplified in Table 2. The use of an alternative encoding scheme in this manner can provide a number of operational benefits such as reduced power consumption, improved response performance, extended operational life of the memory, etc.

FIG. 7 shows two different encoding schemes that could be alternatively applied to the MTJ structure 148 of FIGS. 4-5. A first encoding scheme uses a sequential assignment of logical states to physical states where state S1=00, S2=01, S3=10 and S4=11. Using this scheme, an MLC STRAM cell with both free layers in the parallel direction, and hence, the lowest resistance, would be interpreted as a logical 00. An MLC STRAM cell with both free layers in the antiparallel direction and hence, having the highest resistance, would be viewed as storing the value 11, and so on.

A second encoding scheme in FIG. 7 uses non-sequential assignments of S2=00, S3=01, S4=10 and S1=11. In this scheme, the logical values are out of sequence with respect to the resistances of the various physical states. For example, the lowest resistance state would be interpreted as corresponding to the logical state of 11, the highest resistance state would be interpreted as corresponding to the logical state 10, and so on.

It is contemplated that the second scheme will work equally as well as the first scheme, and may provide significant power savings over the first scheme during normal operation. Empirical analysis suggests that some encoding schemes may provide power savings as much as around 40% or more as compared to other schemes.

In general, for an N-state MLC cell, there can be up to N! different available encoding schemes. The 4-state MTJ structure 148 provides 4!=24 different possible encoding schemes. These different encoding schemes are listed in FIG. 8. Respective total energy usage values for each scheme are provided in FIG. 9.

Figure 9:
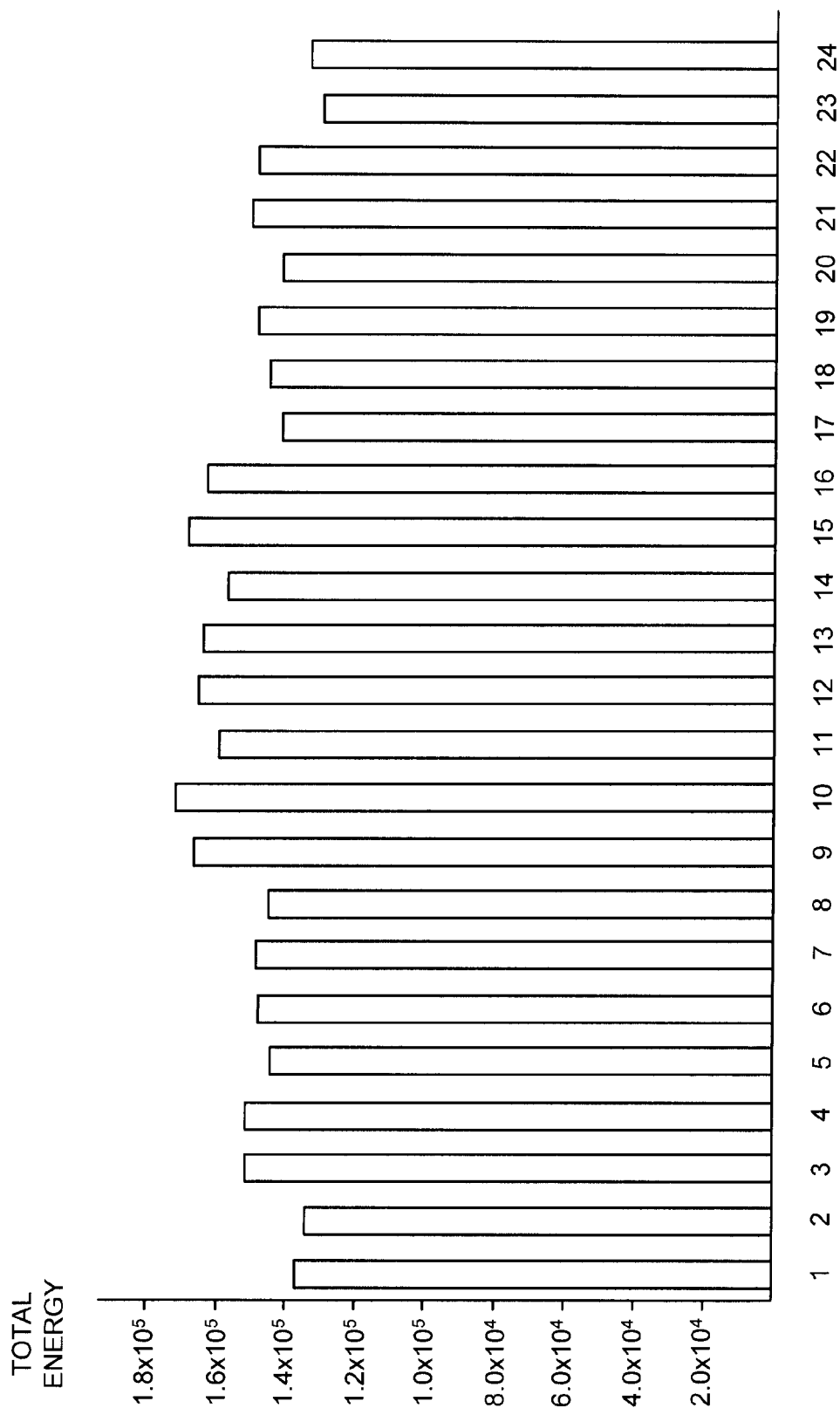
FIG. 9 graphically illustrates total energy consumption data for each of the alternative encoding schemes of FIG. 8.

Energy usage data such as represented in FIG. 9 can be determined empirically in a number of ways, such as by selecting each scheme in turn, and carrying out a predetermined sequence of write and read operations to the array using the selected scheme while measuring total power consumption or other suitable metric (e.g., maximum current, etc.). A look up table or other algorithm can be implemented in the read and write circuitry to implement each scheme in turn. From FIG. 8, encoding scheme 2 provides the lowest power consumption, and encoding scheme 10 provides the highest power consumption. Based on these results, scheme 2 might be selected as the optimum encoding scheme for implementation.

It will be noted that different types of data loads might provide different results for a given memory, so that the selection mechanism may be adaptive; for example, a first scheme might be initially selected at time t0, and over time frequency statistics and/or energy consumption statistics might be accumulated, leading to the decision to switch to a second scheme at a subsequent time t1.

If most of the data writes do not result in a state change, there might be a significant write penalty to change a particular set of memory cells from a first selected scheme to a second selected scheme. The return on investment in terms of future savings, such as reduced power consumption, extended life, improved data throughput, etc., can be taken into account in determining whether it would be advantageous to proceed with changing over to a different scheme.

In some embodiments, all of the MLC cells in a memory array are encoded with the same non-sequential encoding scheme. In other embodiments, a particular memory array might use different encoding schemes in different areas of the array; for example, it might be found advantageous to apply different encoding schemes to different rows (or columns) of the memory cells 106 in FIG. 2.

In sum, the exemplary MLC STRAM cells of FIGS. 3-5 have been described as having four different physical states that correspond to first, second, third and fourth resistances R1, R2, R3, R4 where R1<R2<R3<R4. These resistances are assigned to four corresponding multi-bit logical values B1, B2, B3, B4 in an order other than B1<B2<B3<B4 and B4<B3<B2<B1. That is, under the non-sequential encoding scheme, the bit values will not be sequential such as (00, 01, 10, 11) or (11, 10, 01, 00), but instead will be non-sequential such as (01, 11, 10, 00), etc.

One advantage of MTJ based memory structures such as the various STRAM cells in FIGS. 3-5 is that the cells can be overwritten from any state to any other state simply by subjecting the memory cells to a write operation with the appropriate write current polarity and magnitude. Other memory structures, such as flash memory, can be overwritten in some directions, but require an erase operation to reset a block of the memory cells back to an initial state. This does not limit the applicability of the present methodology. Rather, the various embodiments disclosed herein can be readily adapted for use with MLC flash memory cells.

Figure 10:
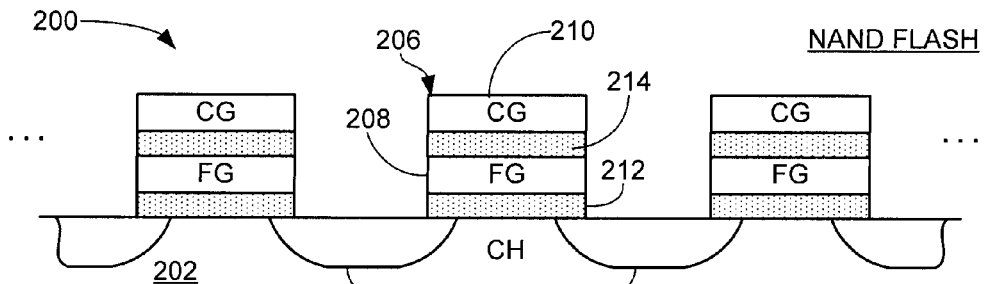
FIG. 10 represents a number of MLC flash memory cells operated in accordance with various embodiments.

FIG. 10 illustrates a set of flash memory cells 200 in accordance with some embodiments. The flash memory cells 200 are organized in a NAND arrangement, although such is not limiting. A semiconductor substrate 202 has a number of spaced apart n+ doped regions 204. A gate structure 206 spans each pair of adjacent regions 204, with each gate structure including a floating gate (FG) 208 and a control gate (CG) 210 separated by intervening insulative layers 212, 214. In this way, the flash memory cells 200 generally resemble nMOSFET transistors, with the provision of additional gate layers.

During initial operation after an erasure operation, the floating gates 208 will have no accumulated charge. Application of a low level gate control voltage to the control gate 210 will produce a conductive drain-source conductive channel (CH) in the substrate 202. This will allow current to flow across the flash memory cell 208. This state is usually assigned a logical value of 11. During a write operation, a larger gate control voltage is applied to the control gate 210, causing migration of charge from the channel to the floating gate 208. This charge remains on the floating gate 208 after this write voltage is applied.

The flash memory cells 200 can be configured as MLC cells through the use of multiple controlled amounts of accumulated charge on the floating gate 208. For example, two bits of data can be stored on each flash memory cell using four (4) different levels of accumulated charge (e.g., essentially no charge, a first intermediate amount of charge, a second higher intermediate amount of charge, and a maximum amount of charge). As before, these states can be identified as states S1, S2, S3 and S4.

It is possible to add additional charge to increase the state level; a cell at state S2 can have additional charge added to it to transition it to state S3 or S4. However, an erasure operation is required to return any higher state back to a lower state. During an erasure, reverse biased current is applied to drive the accumulated charge from the floating gate back to the channel, thereby resetting the cell to the first state S1 (e.g., logical 11).

Figure 11:
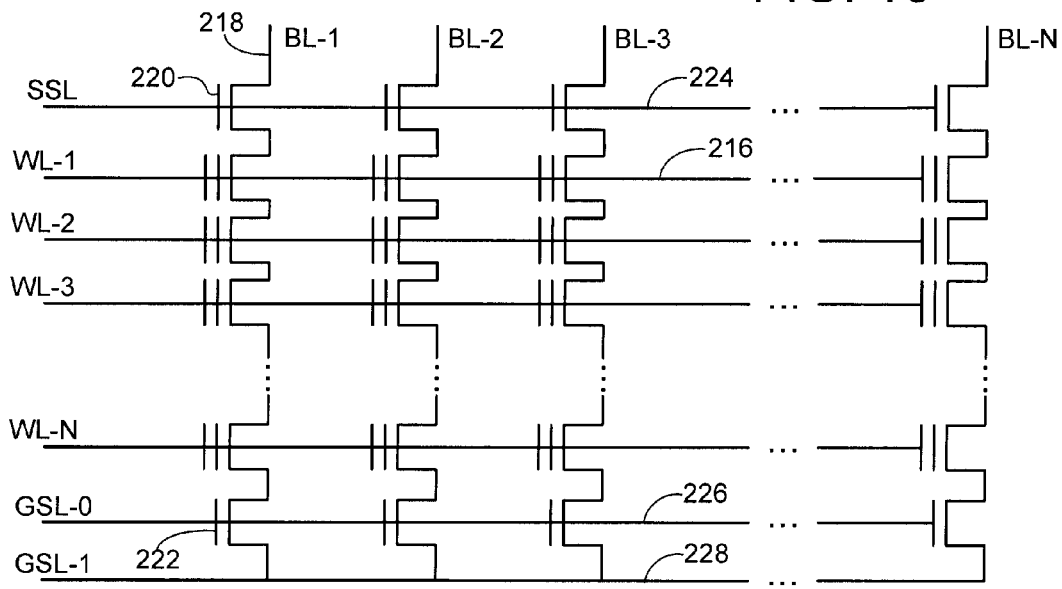
FIG. 11 is a schematic depiction of a flash memory array made up of cells from FIG. 10.

FIG. 11 shows a portion of a memory array, such as the module 104 in FIG. 1, configured as an array of MLC flash cells 200 from FIG. 10. The cells 200 are arranged into rows and columns, with each row of cells connected to a common word line 216 (WL-1 to WL-N) and each column of cells connected to a common bit line 218 (BL-1 to BL-N). Column control transistors are denoted at 220 and 222, and global control lines (SSL, GSL-0 and GSL-1) are denoted at 224, 226 and 228. Data may be stored as a page of memory made up of all of the flash MLC cells 200 along a selected row connected to a common word line 216.

Figure 12:
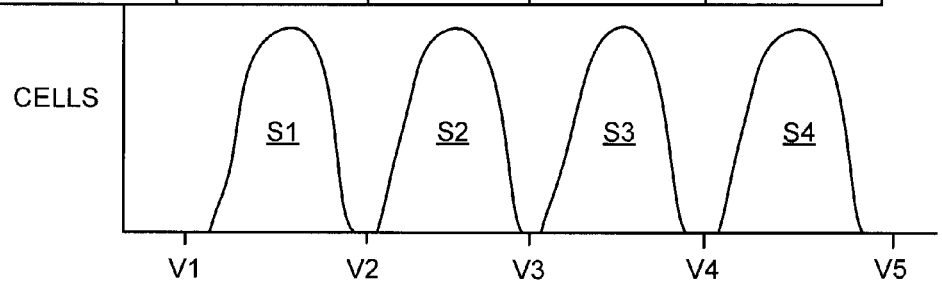
FIG. 12 shows different threshold voltages that may be used to store data in the MLC flash memory cells in accordance with two alternative encoding schemes.

FIG. 12 provides a graphical representation of different populations of the flash MLC cells 200 programmed to the different states S1, S2, S3 and S4. The programmed state of any selected MLC cell 200 from FIG. 11 can be determined by turning on the SSL and GSL-0 lines to render the control transistors 220, 222 in a conductive state, applying an appropriate voltage $V_{DD}$ to the selected bit line 218 connected to the selected cell 200, and setting the GSL-1 line to ground ($V_{SS}$). The word line 216 connected to the selected cell 200 can then be strobed with a sequence of different gate control voltages V1, V2, V3 and V4, where V1<V2<V3<V4 as shown in FIG. 12. The remaining word lines may receive the highest voltage V5.

As will be recognized, these control voltages are selected such that a programmed cell that has a threshold voltage that is lower than the voltage will be placed in a conductive state; for example, voltage V4 is sufficient to turn on a flash memory cell in the population of cells in states S1, S2 and S3, but not the cells in state S4. Thus, a sequence of gate voltages can be sequentially applied to the word line of the selected cell.

In one example, the V3 voltage might be applied first to see if this renders the cell conductive. If not, then the programmed state is either S3 and S4, and a subsequent application of V4 will determine which. Similarly, if V3 rendered the cell conductive, the cell is either in state S1 or S2, and a subsequent application of V2 will determine which. A flash cell can be identified as being in a conductive state if the bit line voltage drops from $V_{DD}$ to a level near $V_{SS}$ in response to the applied gate voltage. Voltage V5 will render all cells conductive irrespective of their programmed states.

FIG. 12 shows two alternative encoding schemes that might be employed with the memory cells 200. A first encoding scheme uses a conventional, sequential assignment of S1=11, S2=10, S3=01 and S4=00. Under this commonly employed scheme, an erased flash cell with no accumulated charge is identified as storing the bit value 11, a flash cell having a maximum amount of accumulated charge is identified as storing the bit value 00, and so on.

A second alternative encoding scheme uses a non-sequential assignment of S1=00, S2=01, S3=11 and S4=10. In this latter case, an erased cell is viewed as storing the value 00, a flash cell having the maximum amount of accumulated charge is viewed as storing the value 10, and so on.

This latter encoding scheme can be selected using data similar to that set forth above in Tables 1 and 2. For example, if logical 00 is found to be the most statistically common logical state in data written under certain conditions, then the erased condition of state S1 might be selected to correspond to this value.

In sum, the MLC flash cells 200 of FIGS. 11-12 have four different physical states that correspond to first, second, third and fourth threshold voltages V1, V2, V3, V4 where V1<V2<V3<V4. These voltages are assigned to four corresponding multi-bit logical values B1, B2, B3, B4 in an order other than B1<B2<B3<B4 and B4<B3<B2<B1.

In other words, the bit values will not be sequential such as (00, 01, 10, 11) or (11, 10, 01, 00), but instead will be non-sequential such as (01, 11, 10, 00), etc.

Figure 13:
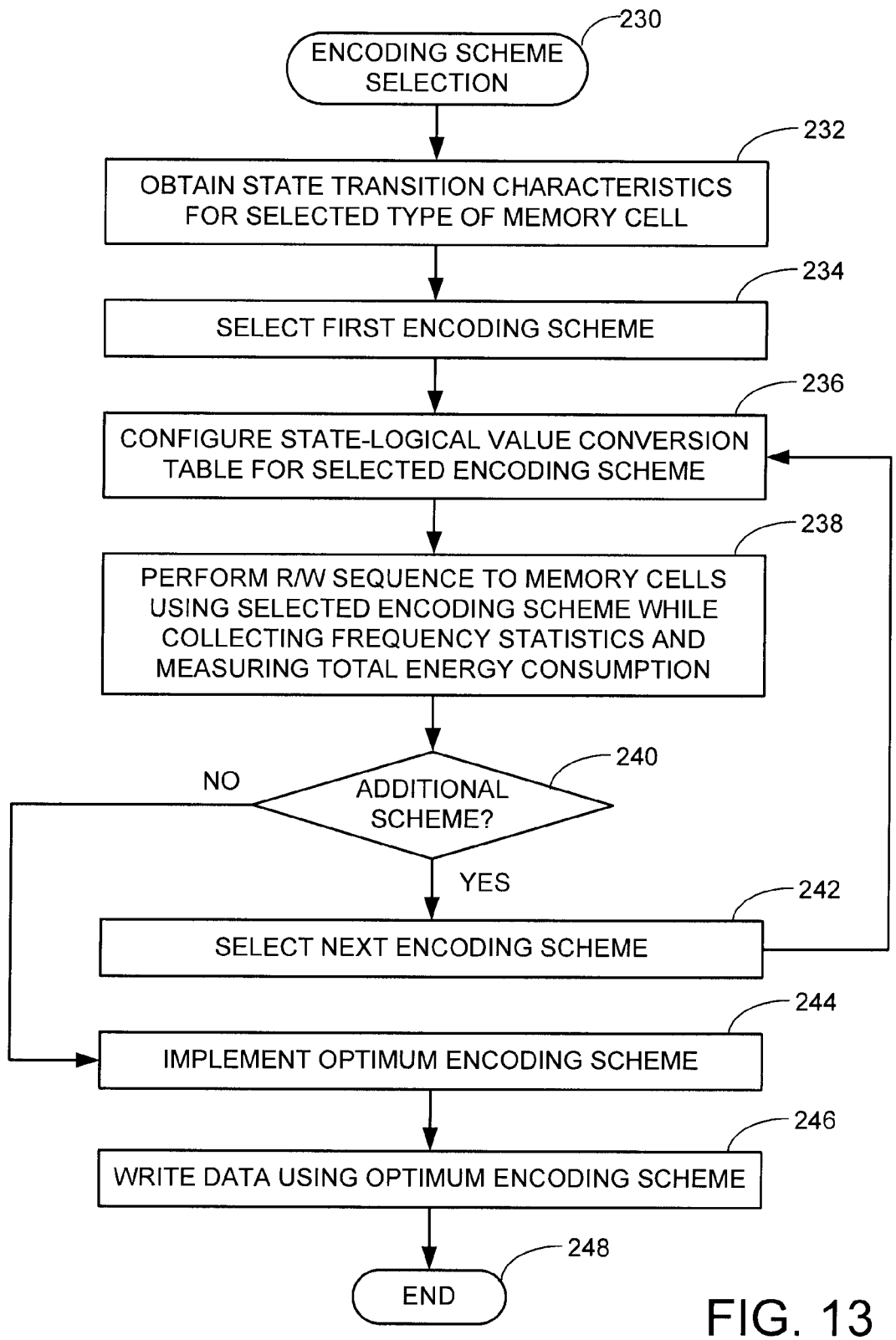
FIG. 13 shows a routine useful in selecting an appropriate encoding scheme for a memory cell in accordance with various embodiments.

FIG. 13 provides a flow chart of an exemplary coding scheme selection routine 230 as performed in accordance with various embodiments. The routine 200 may be carried out on any number of different types of MLC memory cells, such as the STRAM or flash MLC memory cells discussed above.

The routine 230 may operates on a memory array that has an initial basic coding scheme so that a new, alternate encoding scheme is implemented in replacement thereof, but such is not required. All of the steps shown in FIG. 13 need not be carried out, so that various steps may be omitted or modified as required. The routine 230 can be carried out under the direction of a device microcontroller using programming steps stored in associated memory, such as the controller 102 in FIG. 1.

Initially, the routine may include an assessment of state transition characteristics at the individual cell level, as shown by step 232. This will provide data such as shown in Table 1 and may be helpful in the selection process. Such individual cell level characterization can involve selecting a particular cell and writing the various physical states in turn while measuring the magnitudes of write current employed to achieve each state transition.

At step 234, a first encoding scheme can be selected, such as one of the 24 exemplary encoding schemes illustrated in FIG. 8. Appropriate state-logical value conversion tables can be configured at step 236 based on the selected encoding scheme. These tables will identify the appropriate write current parameters necessary to write a selected multi-bit value to the associated cell, thereby placing the cell in the physical state that corresponds to that bit value. The tables may be applied to an entire array or a portion thereof.

A selected read/write sequence is next applied at step 238 to a set of the memory cells in the array using the selected encoding scheme. The sequence may be predetermined based on a baseline set of data, or may correspond to real-world R/W sequences experienced during normal device operation. During this operation, various types of data may be collected such as frequency statistics and total energy consumption data. The frequency statistics may correspond to the type of data in Table 2, and may generally reflect the relative occurrence of different multi-bit values that are written to the memory cells. The total energy consumption data may correspond to the data shown in FIG. 9 for the selected encoding scheme. Alternatively or additionally, data associated with different wear levels and their associated impact on operational life of the memory cells may be obtained.

Decision step 240 determines whether a different encoding scheme is available for evaluation; if so, the routine passes to step 242 where the next encoding scheme is selected and the foregoing steps are repeated.

Once all the desired encoding steps have been evaluated, the flow passes to step 244 where an optimum encoding scheme is selected for implementation, after which data are subsequently written using the selected scheme at step 246. The routine then ends at step 248, although it will be appreciated that various steps in the routine may be repeated over time to implement a new, replacement encoding scheme as desired.

The encoding scheme selection process may take into account a number of parameters, such as power consumption, reductions in circuit complexity, speed, affects on operational life, etc. A weighted sum of these different parameters can also be used.

In some embodiments, an empirical approach is employed in which each of the available encoding schemes is individually evaluated using the same or similar R/W sequence. In such case, the best encoding scheme might be selected as the scheme that produced the best results during the testing, such as the best power consumption requirements as set forth in FIG. 9.

In other embodiments, an evaluation of the state transition data from step 232 and the frequency statistics from step 238 may be sufficient to enable selection of the optimum encoding scheme for the array. For example, it may be possible to link those state transitions that require the smallest write effort with those logical combinations that most frequently occur in the R/W sequence. It will be appreciated that this latter approach does not necessarily require that each available encoding scheme be actually tested in turn.

In still further embodiments, the state transition data and the frequency statistics are used to identify a selected subset of encoding schemes that show promising signs of providing improved performance, and these schemes are then individually tested and evaluated to select the final scheme. It may be desirable in some cases to compare the performance of an alternative, non-sequential encoding scheme to a conventionally applied sequential scheme to assess the efficacy of the alternative scheme.

The routine will generally operate to implement a final encoding scheme that is based on write effort to achieve the various physical states of the cells, regardless of whether individual write transition characteristics are quantified as in Table 1, actual frequency statistics are collected as in Table 2, and/or each available encoding scheme is individually assessed as in FIG. 9.

It will be appreciated that once data are written to an array using a selected encoding scheme, the conversion table(s) can be referenced by the control circuitry during a subsequent read operation to recover (decode) the data previously written to the array. The conversion tables may be stored in a metadata region of the array and loaded to a local volatile memory (e.g., registers 124 in FIG. 2) during device initialization.

It will now be appreciated that the various embodiments illustrated herein may provide benefits in the area of memory array management. The ability to optimize an array, or a portion of the array, with a coding scheme that is specifically tuned to tested logical state combination frequencies provides enhanced memory array performance with minimal additional circuitry or processing.

Moreover, the ability to customize a coding scheme for an array page-by-page provides a heightened element of tuning that improves array performance. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
selecting a non-sequential encoding scheme that assigns a different multi-bit logical value to each of a plurality of available physical states of a selected multi-level cell (MLC) memory cell in relation to write effort associated with each of said plurality of physical states, the selected encoding scheme assigning a first multi-bit logical value to a first physical state having a first value, a second multi-bit logical value to a second physical state having a second value, and a third multi-bit logical value to a third physical state having a third value between the first value and the second value, the third multi-bit logical value greater than the first and second multi-bit logical values; and
writing data to the selected MLC memory cell in relation to said non-sequential encoding scheme.

2. The method of claim 1, in which the MLC memory cell is adapted to store a plural number n independent bits in relation to $2^n$ physical states of the cell.

3. The method of claim 1, in which the MLC memory cell is adapted to store data in a plural number N different physical states, and the selected non-sequential encoding scheme is selected from a total of N! available encoding schemes.

4. The method of claim 1, in which the selecting step comprises transitioning the MLC memory cell to each of the plurality of available physical states in turn by applying write current to said cell, measuring a magnitude of said write current for each transition, and selecting the non-sequential encoding scheme in relation to said measured write currents.

5. The method of claim 1, wherein the selected encoding scheme assigns a first multi-bit logical value to a first physical state having a low resistance, a second multi-bit logical value to a second physical state having a high resistance in relation to the low resistance, and a third multi-bit logical value to a third physical state having a resistance between the respective low and high resistances of the first and second physical states, and wherein the third multi-bit logical value is greater than the first and second multi-bit logical values.

6. The method of claim 1, in which the selected non-sequential encoding scheme provides a lower total energy consumption level as compared to a sequential encoding scheme for the MLC memory cell.

7. The method of claim 1, in which the selecting step comprises storing data to a memory array in which the MLC memory cell is disposed, accumulating frequency statistics for each multi-bit logical value written to said array during the storing step, storing said frequency statistics in a memory, and using the stored frequency statistics to identify the selected non-sequential encoding scheme.

8. The method of claim 1, in which the physical states of the memory cell comprise first, second, third and fourth resistances R1, R2, R3, R4 such that R1<R2<R3<R4, and wherein said resistances are respectively assigned to corresponding multi-bit logical values B1, B2, B3, B4 in an order other than B1<B2<B3<B4 and B4<B3<B2<B1.

9. The method of claim 1, in which the physical states of the memory cell comprise first, second, third and fourth threshold voltages V1, V2, V3, V4 such that V1<V2<V3<V4, and wherein said voltages are respectively assigned to corresponding multi-bit logical values B1, B2, B3, B4 in an order other than B1<B2<B3<B4 and B4<B3<B2<B1.

10. The method of claim 1, in which the selecting step comprises identifying a population of available alternative encoding schemes for the MLC memory cell each scheme in said population establishing different multi-bit logical value to physical state assignments, writing data to an array in which the MLC memory cell is disposed using each of the schemes in turn, and selecting the non-sequential scheme from the population that exhibits a lowest total energy consumption.

11. A method comprising:
  providing an array of multi-level cell (MLC) memory cells, each cell adapted to store a plural number n independent bits in relation to $2^n$ physical states of the cell;
  assigning a non-sequential encoding scheme to the array that associates each physical state of a selected cell to a different n-bit combination of logical bit values in relation to a write effort required to achieve said physical state by storing data to the array in accordance with a predetermined sequence of write commands and associated write data arranged as multi-bit logical values, accumulating frequency statistics for each multi-bit logical value written to said array during the storing data step, storing said frequency statistics in a memory, and using the stored frequency statistics to identify the assigned non-sequential encoding scheme; and
  writing a selected n-bit combination of logical bit values to the selected cell using the assigned encoding scheme.

12. The method of claim 11, in which the MLC memory cells are characterized as STRAM memory cells each having a plurality of magnetic tunneling junctions (MTJs).

13. The method of claim 11, in which the MLC memory cells are characterized as flash memory cells.

14. The method of claim 11, in which the assigning step comprises transitioning the selected cell to each of the plurality of available physical states in turn by applying write current to said cell, measuring a magnitude of said write current for each transition, and selecting the non-sequential encoding scheme in relation to said measured write currents.

15. The method of claim 11, wherein the assigned encoding scheme associates a first multi-bit logical value to a first physical state having a low resistance, a second multi-bit logical value to a second physical state having a high resistance in relation to the low resistance, and a third multi-bit logical value to a third physical state having a resistance between the resistances of the first and second physical states, and wherein the third multi-bit logical value is greater than the first and second multi-bit logical values.

16. The method of claim 11, wherein the assigned encoding scheme associates a first multi-bit logical value to a first physical state having a first value, a second multi-bit logical value to a second physical state having a second value, and a third multi-bit logical value to a third physical state having a third value between the first value and the second value, and wherein the third multi-bit logical value is greater than the first and second multi-bit logical values.

17. The method of claim 11, further comprising generating a conversion table that associates each of the physical states with the associated n-bit combination of logical bit values, storing the conversion table in a memory, using the conversion table during the writing step to place the selected cell in a selected physical state corresponding to a selected n-bit combination of logical bit values to be written thereto, and using the conversion table during a subsequent reading step to recover data stored to the array.

18. An apparatus comprising:
  an array of multi-level cell (MLC) memory cells, each cell adapted to store a plural number n independent bits in relation to $2^n$ physical states of the cell;
  a controller adapted to assign a non-sequential encoding scheme to the array that associates each physical state of a selected cell to a different multi-bit logical value in relation to a write effort required to achieve said physical state, and to subsequently direct a write operation upon the array to write a selected multi-bit logical value to the selected cell using the assigned encoding scheme; and
  a memory which stores a conversion table that associates each of the physical states with its associated multi-bit logical value, wherein the controller utilizes the conversion table during write and read operations with the array.

19. The apparatus of claim 18, the MLC memory cells characterized as non-volatile spin-torque transfer random access memory (STRAM) cells, the memory comprising a volatile memory.

20. The apparatus of claim 18, in which the controller is adapted to identify a population of available alternative encoding schemes for the MLC memory cell each scheme in said population establishing different multi-bit logical value to physical state assignments, direct a writing of data to the array using each of the schemes in turn, and selecting the non-sequential scheme from the population that exhibits a lowest total energy consumption.

* * * * *